United States Patent [19]

Choi

[11] Patent Number: 5,031,013

[45] Date of Patent: Jul. 9, 1991

[54] INFRARED HOT-ELECTRON TRANSISTOR

[75] Inventor: Kwong-Kit Choi, Tinton Falls, N.J.

[73] Assignee: The United States of America as represented by the Secretary of the Army, Washington, D.C.

[21] Appl. No.: 567,050

[22] Filed: Aug. 13, 1990

[51] Int. Cl.$^5$ .................... H01L 29/205; H01L 31/06
[52] U.S. Cl. ......................................... 357/30; 357/4; 357/16; 357/34
[58] Field of Search .................... 357/4, 16, 34, 30

[56] References Cited

U.S. PATENT DOCUMENTS

| | | | |
|---|---|---|---|
| 4,712,121 | 12/1987 | Yokoyama | 357/34 |
| 4,873,555 | 10/1989 | Coon et al. | 357/34 |
| 4,894,526 | 1/1990 | Bethea et al. | 357/4 |
| 4,903,101 | 2/1990 | Maserjian | 357/30 |

OTHER PUBLICATIONS

Choi et al, *Appl. Phys. Lett.* (50) (25), Jun. 22, 87, pp. 814–816, "Multiple Quantum Well . . . Responsivity".
Levine et al, *Appl. Phys. Lett.*, vol. 56, No. 9, Feb. 26, 90, pp. 851–853, "High Sensitivity in Photodetectors".
Reed et al, *Appl. Phys. Lett.*, 54(11), Mar. 13, 89, pp. 1034–1036, "Realization . . . Tunneling Transistor".

Primary Examiner—Jerome Jackson, Jr.
Attorney, Agent, or Firm—Michael Zelenka; Judith Michal

[57] ABSTRACT

An infrared hot-electron transistor comprising a doped multiple quantum well structure as an infrared radiation sensitive unit, and an electron energy filter as a dark current reduction unit. Infrared radiation incident on the device gives rise to intersubband absorption. After having absorbed an infrared photon, each photoelectron is one photon energy higher in energy than that of the dark electron, and hence can be separated by an electron energy filter. The transistor consists of three terminals, each of them has an indispensable function. The emitter supplies electrons, the collector collects photoelectrons, and the base provides drainage to the unwanted dark electrons.

3 Claims, 6 Drawing Sheets

INFRARED HOT-ELECTRON TRANSISTOR

GOVERNMENT INTEREST

The invention described herein may be manufactured, used, and licensed by or for the Government for governmental purposes without the payment to me of any royalties thereon.

FIELD OF INVENTION

The present invention relates in general to infrared detection devices and, more particularly, to detection devices with a built-in noise reduction mechanism

BACKGROUND OF THE INVENTION

Large scale infrared detector arrays are needed for thermal imaging purposes. Thermal imaging has a wide range of applications, from military night vision systems to astrophysics to medical diagnostics. In these applications, individual detectors not only need to be sensitive and fast, but more importantly, their device characteristics have to be uniform. In addition, if a detector array is connected to Charge Coupled Devices (CCD) for signal read-out, the dark current, which is the current flowing through each detector without being exposed to light, has to be small due to the limited charge handling capacity of the CCD. Recently, Levine et al. have disclosed a new multiple quantum well photodetector. This device is discussed in two separate articles, the first of which is "New 10 Micron Infrared Detector Using Intersubband Absorption in Resonant Tunneling GaAlAs Superlattices", Applied Physics Letters, Vol. 50 (1987), pg. 1092-1094. The authors introduce a high speed infrared detector based on intersubband absorption and sequential resonant tunneling in doped $GaAa/Al Ga_x 1-x As$ quantum well superlattices. They term the device a STAIR detector. In this type of detector, infrared light which is in resonant with the intersubband transition excites electrons from the doped ground state to the excited state where they can tunnel out of the well through the thin top of the barrier. These photogenerated hot electrons then travel a mean free path thereby generating a photocurrent before being captured by the wells. "High Sensitivity Low Dark Current 10 Micron GaAs Quantum Well Infrared Photodetectors,"Applied Physics Letters, Vol. 56 (1990), pg. 851-853, also by Levine et al. contributes no novel features but does extend the range of parameters of the device.

In a related article by Kwong-Kit Choi et al, entitled "Multiple Quantum Well 10 micron $GaAs/Al Ga_x 1-x As$ Infrared Detector With Improved Responsivity," a higher responsivity is achieved in this type of device. This occurs by using thicker and higher $Al Ga_x 1-x As$ layers as superlattice barriers to reduce the dark current. This allowed the detector to be operated at higher biases. Additional background can be obtained from European patent No. 88300096.0- "Infrared Radiation Detector Devices," filed by Clyde G. Bethea et al.

The essential feature of this type of device is that the detector consists of a number of isolated quantum wells. In order to limit the tunneling dark current from the ground state, thick superlattice barriers have to be adopted. However, thick barriers will also limit the photoexcited electrons from tunneling out of the well and forming free electrons. The approach of Levine et al. is to use low barriers so that the excited state is above the barriers. The photoexcited electrons do not need the tunneling process to become free. The disadvantage of this approach is that the low barriers cannot limit the thermally activated dark current which is dominated at high temperatures such as 77° K. In fact, the low barrier detectors, which contain only one confined state, perform worse than a detector with two bound states at 77° K. due to the large thermal dark current at high temperatures.

SUMMARY OF INVENTION

It is therefore an object of this invention to introduce a dark current suppressing structure into the detector to lower the dark current at all temperatures.

This object and other objects are achieved in accordance with the present invention, which includes in a normal multiple quantum well photodetector either a single barrier which acts as an electron energy high pass filter, or a strongly coupled superlattice structure acting as an electron energy band pass filter. The entire device thus forms an infrared hot-electron transistor.

The present invention comprises a doped multiple quantum well (MQW) structure which forms the infrared light sensitive region. The MQW structure is sandwiched between a doped conducting layer on the top which acts as the emitter contact, and another conducting layer at the bottom which acts as the base contact. Underneath the base, there is either a single undoped barrier or an undoped superlattice forming the electron energy filter. The filter layer is followed by a doped layer which functions as the collector.

The filter is designed such that the filter only allows the electrons with a particular range of energies, which in this case is the photoexcited electron energies, to pass through the filter and to be collected at the collector. The rest of the electrons, which constitute the dark current, are separated from the photocurrent and drained through the base. By measuring the collector current, the dark current flowing through the photosensitive region can be filtered out. The filtering results in a decrease of the dark current level, an increase of the photocurrent to dark current level and a increase in the detectivity of the detector as the noise associated with the dark current is reduced.

In the preferred embodiment, the barrier height of the high pass filter or the location of the first miniband of the band pass filter should be arranged such that the maximum photocurrent to dark current ratio can be obtained at the collector under the optimum operating voltage across the light sensitive region.

BRIEF DESCRIPTION OF THE DRAWINGS

The invention will be more fully appreciated from the following detailed description when the same is considered in connection with the accompanying drawings in which.

DETAILED DESCRIPTION OF THE DRAWINGS

Figure 1:
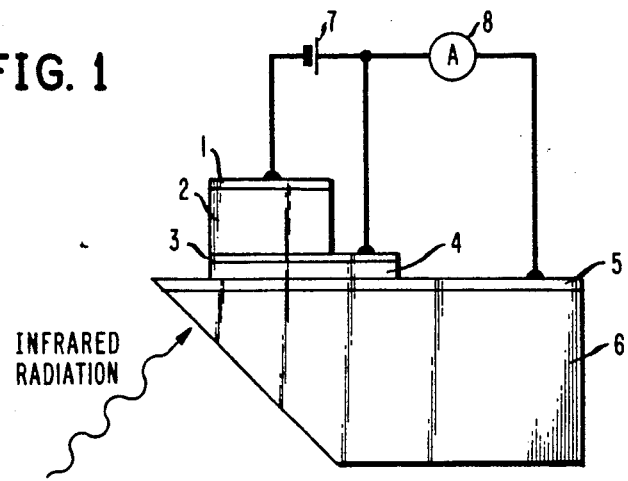
FIG. 1 is a schematic representation, greatly enlarged, of the structure of an infrared radiation detector in accordance with the present invention in an arrangement which further includes a voltage source and a current measuring device.

FIG. 1 shows an emitter contact layer (1), a multiple quantum well structure (2), a base contact (3), an electron energy filter (4), a collector contact (5), a semi-insulating substrate (6), an external voltage source (7), and a current meter (8) which complete an electric circuit for light sensing operation. In operation, the detector is cooled to a desired temperature and the polished face of the substrate is then exposed to the infrared radiation. The device is biased by a voltage source through the emitter and base contact layers, and the photocurrent can be sensed either by a current meter or by a series resistor.

Illumination of the multiple quantum well structure is shown at an angle via a polished face of the substrate which has been cut at an angle. This was found to be convenient for experimental device evaluation. The angle shown in FIG. 1 is a 45° angle. A multiple quantum well structure is a periodic arrangement of layers of two different materials such as ABABAB... where A represents one layer and B represents another layer. Infrared radiation is made incident on these layers. In order to initiate excitation, the electric field vector associated with the radiation has to be perpendicular to the material layers. That is, the light has to travel parallel to the layers. One convenient way to do this is to have the radiation incident on the multiple quantum well structure at the 45° angle shown. With this arrangement, the radiation with the electric vector component perpendicular to the multiple quantum well structure layers will be absorbed. More generally, illumination may be in any direction having an electric field component perpendicular to the multiple quantum well layers.

Figure 2:
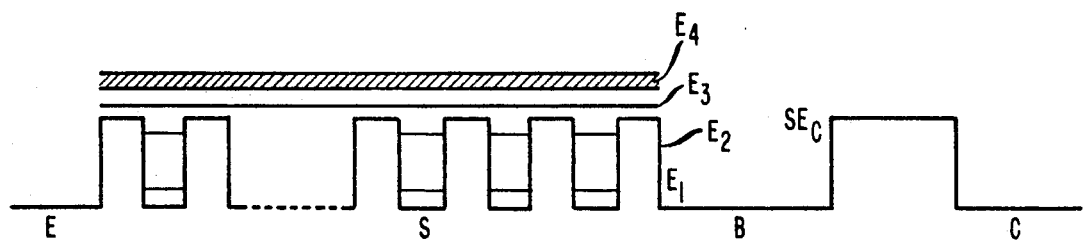
FIG. 2 is the energy band diagram of the present invention.

A quantum well is created when a smaller band gap material is placed between two wider band gap materials. Likewise, a quantum barrier is created when a wider band gap material is placed between two smaller band gap materials. A quantum well acts like a "trap" to an electron. Inside a quantum well, there are discrete energy levels due to size quantization. The present invention comprises an array of doped quantum well units. A typical embodiment of the present invention might consist of fifty units. FIG. 2 shows four units. These units (S) are sandwiched between the emitter contact layer (E) and the base contact layer (B). Next to the base contact layer, there is an electron energy filter layer which can either be another array of thin quantum barriers or be a single thick quantum barrier as shown in FIG. 2. The current that passes through the filter layer is connected to a current meter through the collector contact (C).

Figure 3:
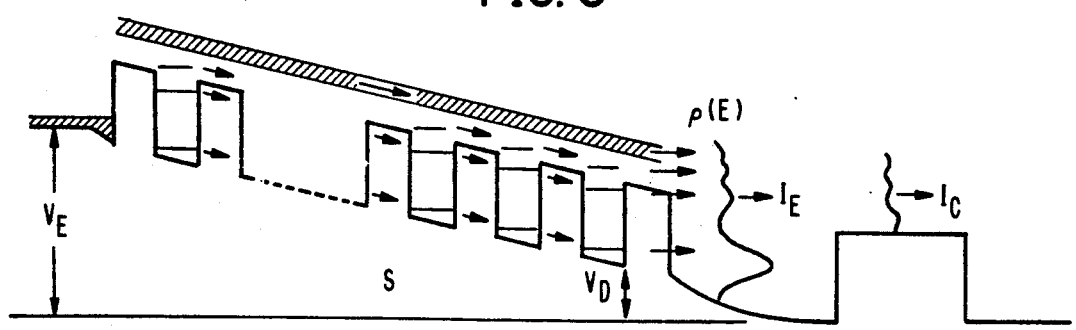
FIG. 3 is an energy diagram illustrating the electron distribution injected from the multiple quantum well structure when the structure is under an applied bias and at a finite temperature.

FIG. 3 shows the electron conduction paths inside the multiple quantum well structure (S) and the electron distribution injected into the base layer at a finite temperature under an emitter voltage bias ($V_E$). The voltage between the base and the collector is usually, but not necessarily, kept at zero volts. FIG. 3 also shows that the part of the electron distribution with energy higher than the barrier height of the filter will overcome the barrier and be collected at the collector as the collector current. The electrons with energy lower than the barrier height of the barrier are blocked by the barrier and are drained through the base as base current. The electron distribution injected from the multiple quantum well structure depends on the temperature. When the temperature is low, all the electrons reside in the ground state (E1), and therefore only one electron distribution peak is injected into the base. At higher temperatures, electrons in the ground state can be excited into the higher states by thermal energy. In this case, the injected electron distribution can consist of multiple peaks. The number of observed peaks depends on the temperature.

Figure 4:
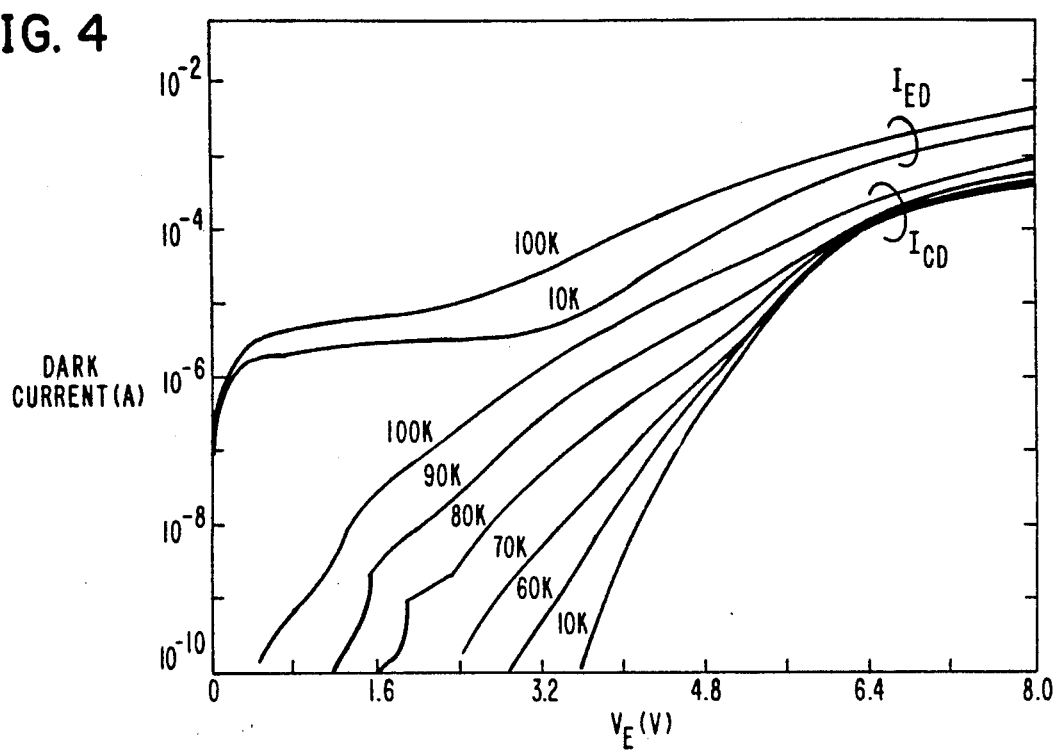
FIG. 4 shows the emitter dark current-voltage characteristics and the collector dark current-voltage characteristics measured at different temperatures.

FIG. 4 is the experimentally measured emitter current ($I_{ED}$) and collector current ($I_{CD}$) without light radiation at different temperatures from a tested transistor. In this particular example, the transistor includes a multiple quantum well structure which consists of 50 periods of 150 Å Ga 0.68 Al 0.32 As undoped barrier and 74 Å GaAs well doped with $n^+ = 2 \times 10$ cm$^{-3}$. The multiple quantum well structure is sandwiched between a heavily doped ($n^+ = 2 \times 10^{18}$cm$^{-3}$, 3000 Å) GaAs layers on the top as the emitter contact, and a lightly doped ($n = \times 10^{17}$cm$^{-3}$, 1500 Å) GaAs layer at the bottom as the base contact. Underneath the base, there is a Ga0.65Al0.35As undoped barrier (1000 Å) as the energy filter, followed by a heavily doped ($n^+ = 2 \times 10^{18}$ cm$^{-3}$, 6000 Å) GaAs layer as the collector. The entire structure is grown on a semi-insulating substrate. With these multiple quantum well structure parameters, there are two confined states in this structure. However, in general, structures with any number of confined levels can be used. The data show that the collector dark current is always less than the emitter dark current at all temperatures due to the filtering effect. At large emitter voltages, the collector current approaches the emitter current due to the fact that the depletion voltage drop ($V_D$) at the base is directly proportional to the applied emitter voltage. As the depletion voltage increases with the emitter voltage, the entire electron distribution is lifted to higher energies as shown in FIG. 3 so that increasing number of electrons can overcome the filter barrier and can be collected as collector current.

Figure 5:
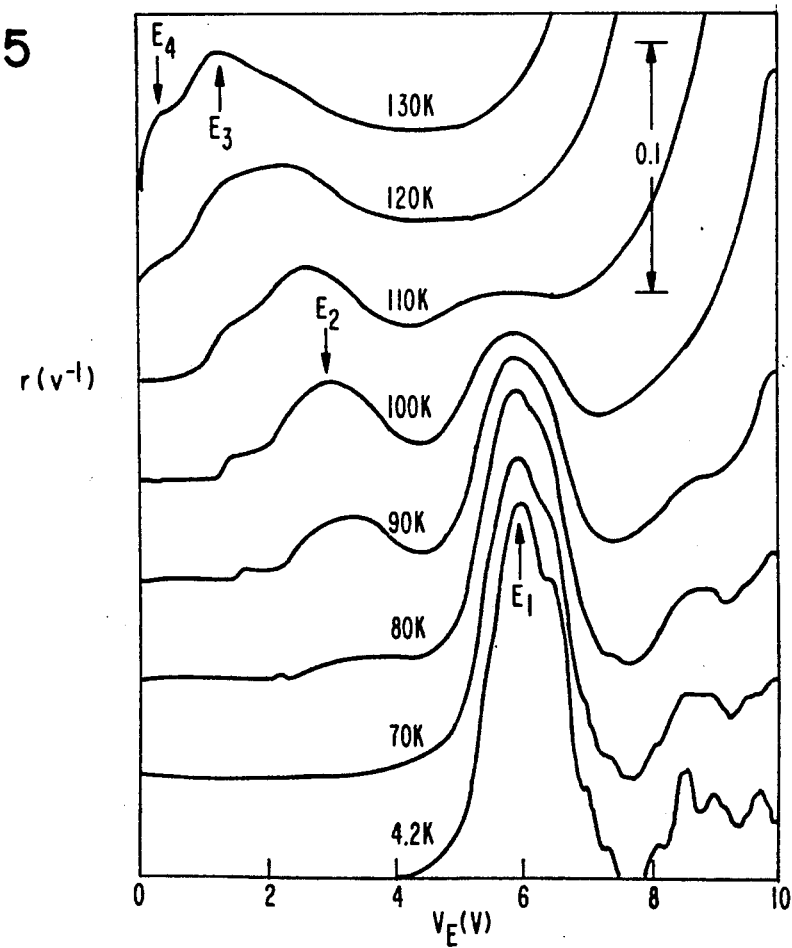
FIG. 5 shows the parameter r which is defined as $d(I_{CD}/I_{ED})/dV_E$ as a function of emitter voltage deduced from the data shown in FIG. 4.

FIG. 5 shows the parameter r at different temperatures as deduced from data in FIG. 4. The parameter r is defined as $d(I_{CD}/I_{ED})/dV_E$. The parameter r is particularly illuminating in understanding the transport mechanisms in the multiple quantum well structure since it can be shown to be directly proportional to the electron distribution injected from the structure into the base. For example, at temperature equal to 4.2° K., there is only one peak in r observed at 5.9 V. This peak represents a group of electrons injected from the ground state $E_1$. At higher temperatures around 100° K., another peak develops at 3.1 V due to the thermal excitation of conduction electrons from $E_1$ to $E_1$. At even higher temperatures, contributions from $E_3$ and $E_4$ are observable. The more energetic electrons are observed at lower emitter voltages since they need less voltage lift to overcome the filter barrier. According to the data at 80° K., the number of electrons injected from $E_2$ is still very small compared with the number of electrons injected from $E_1$. Therefore, if the structure is biased around 4 V to 5 V, only the electrons injected from $E_1$ will be collected at the collector, while electrons from E will be blocked by the filter and cannot pass to the collector. Meanwhile, the expected photoexcited electrons, which are created from optical transitions from $E_1$ to $E_2$, will be injected from $E_2$ and hence can overcome the barrier between 4 V to 5 V. Hence, by measuring the collector current instead of the emitter current which is the usual photoconductor response, the dark current can be largely discriminated. This filtering will decrease the dark current level, increase the photocurrent to dark current level, and increase the detectivity of the detector as the noise associated with the dark current is being reduced.

Figure 6:
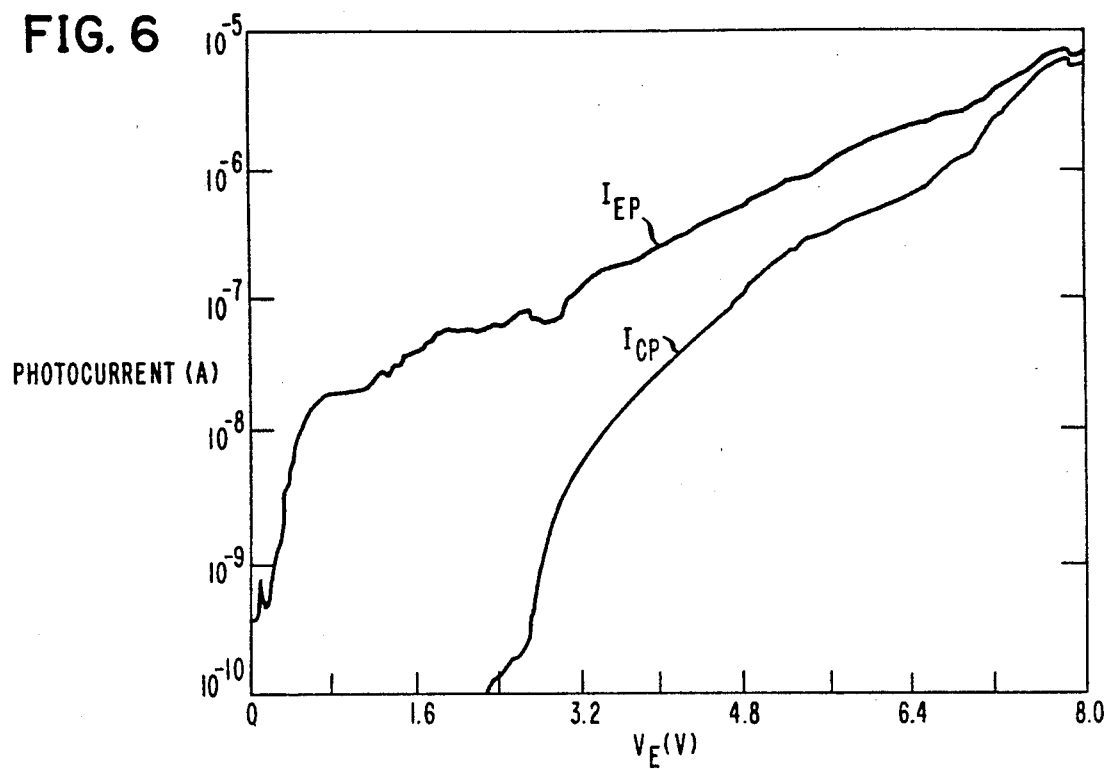
FIG. 6 shows the measured emitter photocurrent and the collector photocurrent as a function of emitter voltage at a temperature equal to 10° K.

FIG. 6 shows the emitter photocurrent ($I_{EP}$) and the collector photocurrent ($I_{CP}$) at 10° K. The wavelength of the radiation is set at 9.5 micrometers with intensity 5.8 mWcm$-2$. The photocurrents show negligible temperature dependence (within 4%) up to 90° K. From this figure, one notices that the photocurrent, which is injected from $E_2$, shows much more filtering effect than the dark current above 3 V.

Figure 7:
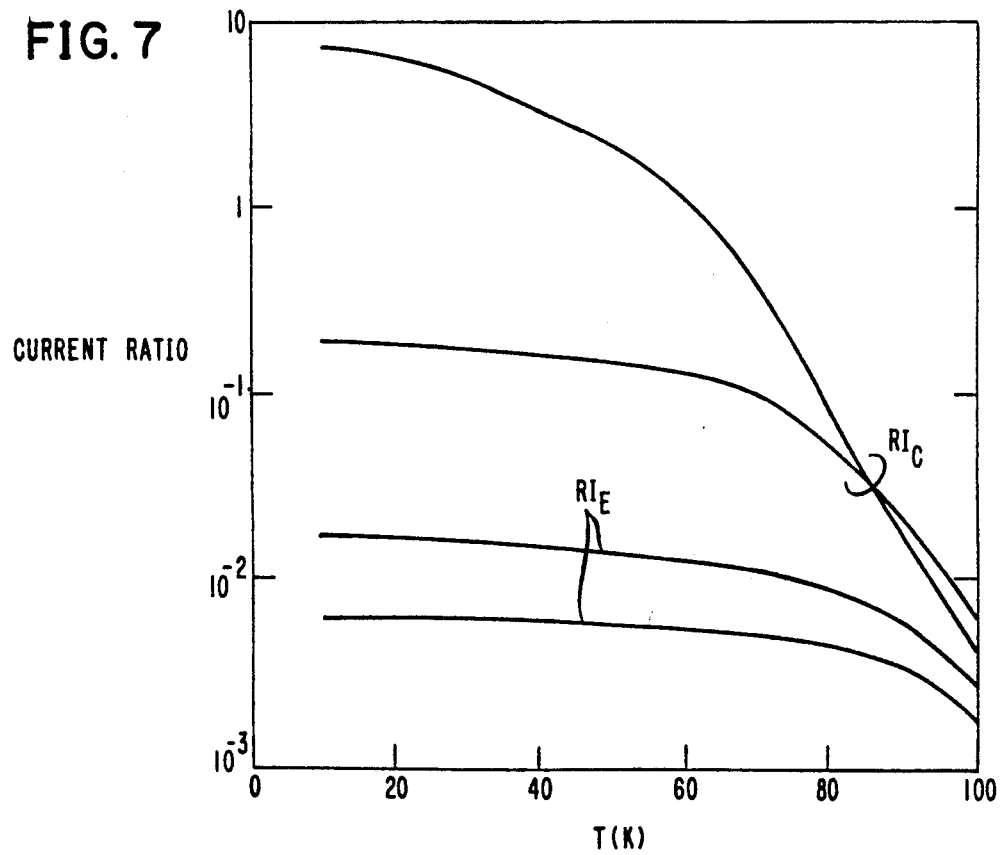
FIG. 7 shows the emitter photocurrent to dark current ratio and the collector photocurrent to dark current ratio as a function of temperature for two values of emitter voltage.
Figure 8:
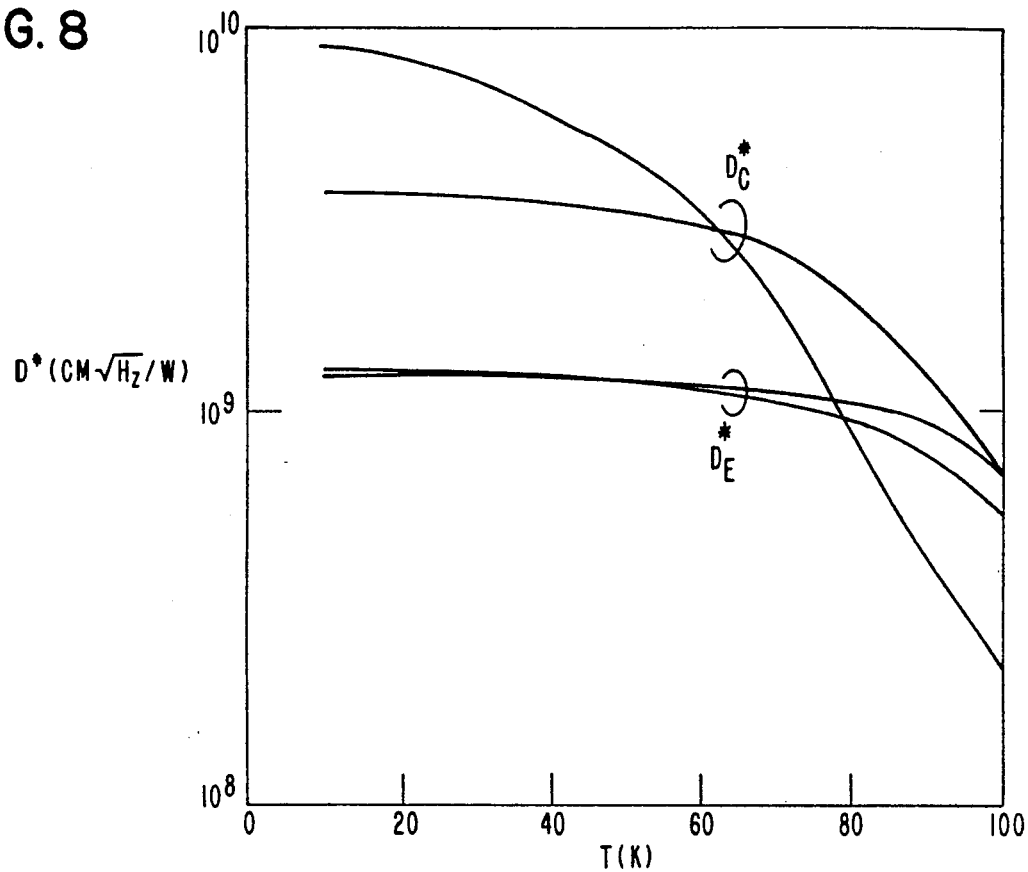
FIG. 8 shows the emitter detectivity and the collector detectivity as a function of temperature at two values of emitter voltage.

FIG. 7 shows the emitter photocurrent to dark current ratio ($RI_E$) and the collector photocurrent to dark current ratio ($RI_C$) at 4 V and 5 V. Note that $RI_C$ is generally larger than $RI_E$. As a result, the detectivity of the detector is improved when measuring the collector current instead of the emitter current as indicated by the values of emitter detectivity ($D_E^*$) and the collector detectivity ($D_C^*$) shown in FIG. 8.

Figure 9:
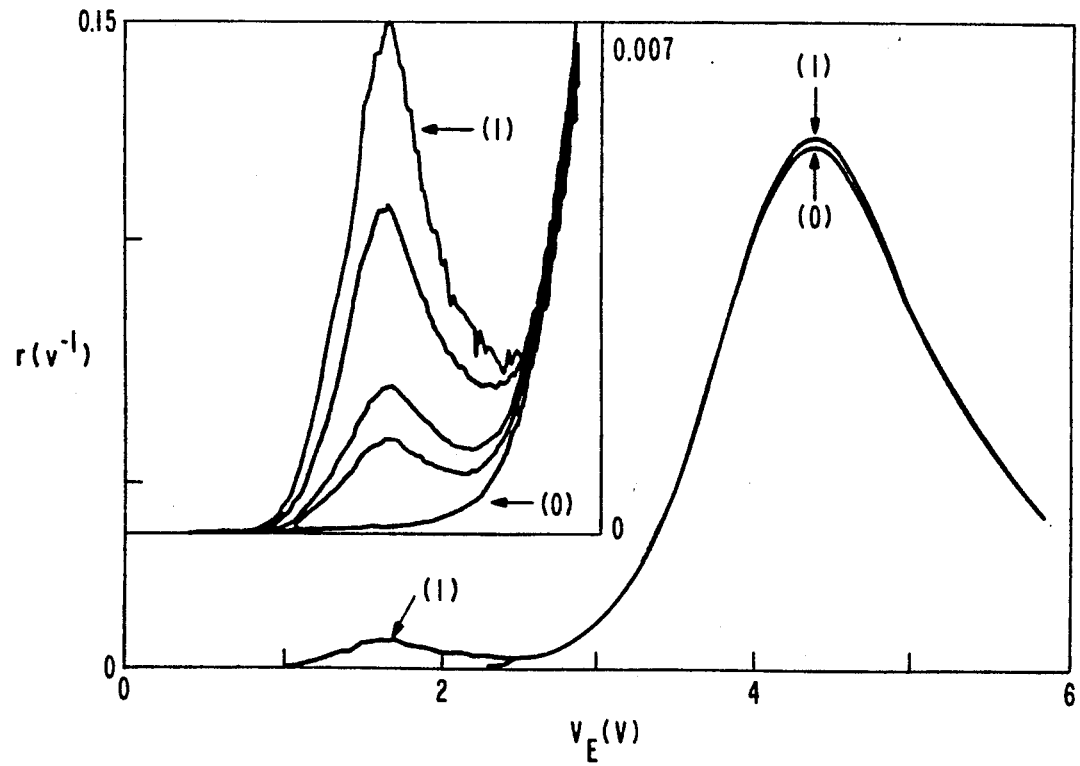
FIG. 9 shows the parameter r of a second detector with and without infrared light illumination at a temperature equal to 10° K.
Figure 10:
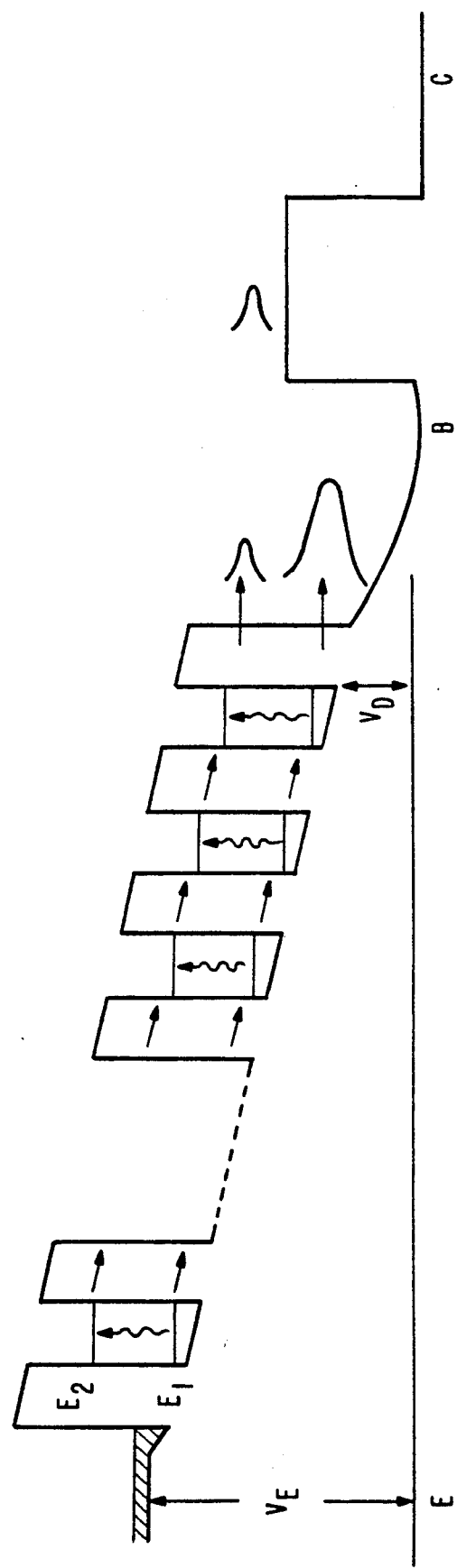
FIG. 10 shows the injected electron distribution under radiation illumination at the optimum biasing condition.
Figure 11:
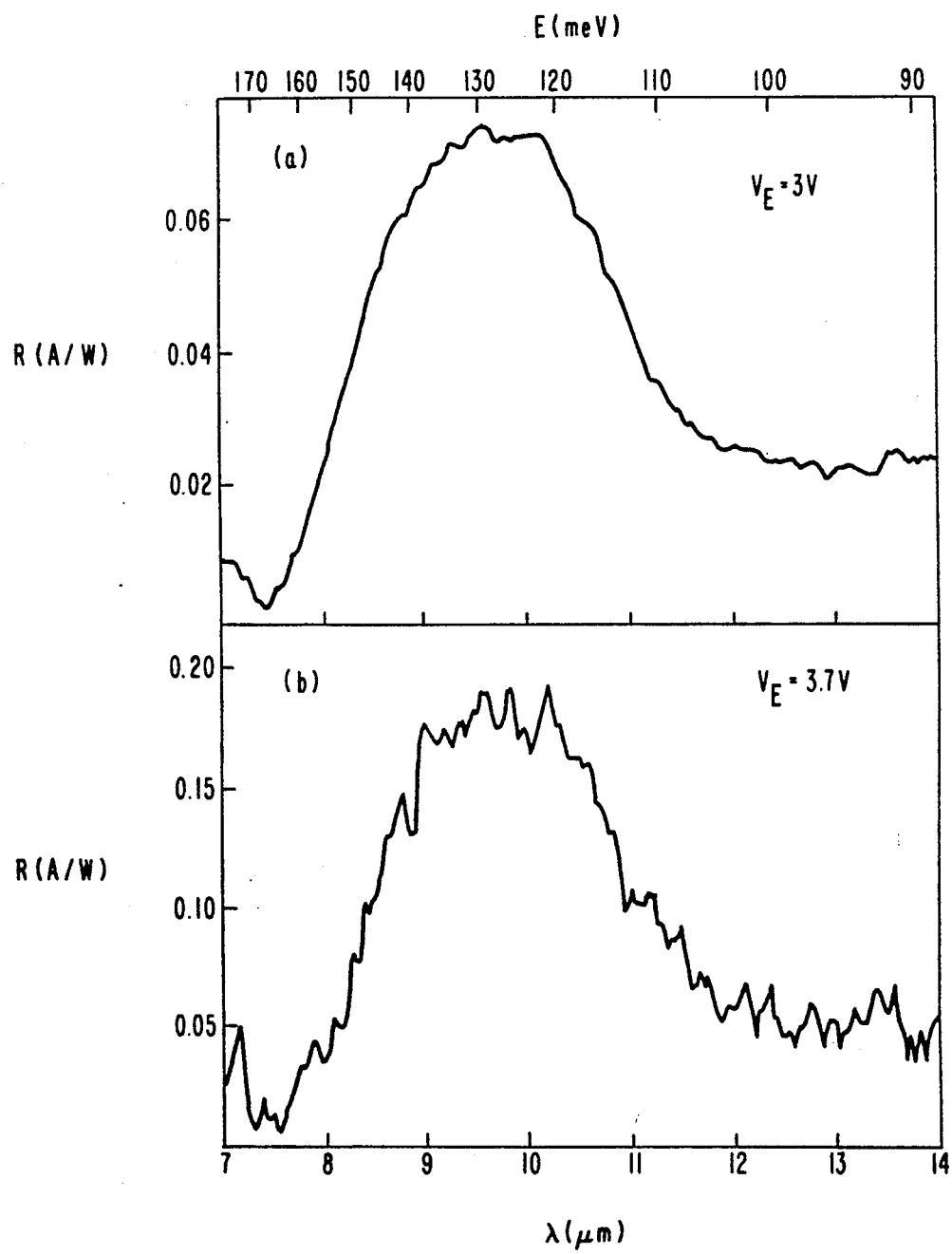
FIG. 11 shows the responsivity of the second detector as a function of the wavelength of the incoming radiation at two different values of emitter voltage.

FIG. 9 shows the parameter r at 10° K. with and without infrared radiation for another transistor of similar structure. The multiple quantum well structure now consists of 50 periods of 150 Å-thick Ga 0.73 Al 0.27 As undoped barrier and 70 Å thick GaAs doped well. The filter barrier is a 700 Å-thick Ga0.73Al0.27As layer. The rest of the material parameters are the same as the previous transistor. The curve labeled (0) is the dark electron distribution and the curve labeled (1) is the distribution under radiation illumination. The insert shows the data in an enlarged scale from 0 to 3 V, with additional data curves for lower levels of light intensity. Under radiation, a sharp photocurrent peak is observed at an emitter voltage equal to 1.65 V. At 3 V, most of the photoelectrons are above the barrier filter, and yet most of the dark current is below the barrier filter. The electron distribution under radiation illumination at this voltage is illustrated in FIG. 10. Therefore, this voltage represents the optimum operating voltage for this particular detector. Indeed, the improvement of the signal to noise level can be observed in FIG. 11. In this figure, the responsivity is monitored as the wavelength of the incoming radiation is scanned. FIG. 11 (a) is the signal observed when the applied emitter voltage is at 3 V. FIG. 11 (B) is the signal observed when the voltage is at 3.7 V, otherwise under the same measuring conditions as in (a). Here it is shown that although the signal at 3.7 V is larger by a factor of 2.6, the noise level is also much higher due to a larger portion of the dark current being accepted at the collector. By operating the transistor at 3 V, the signal to noise in fact increases by a factor of 2.8, which demonstrates the utility of the filter.

Other and different approximations to the infrared hotelectron transistor may occur to those skilled in the art. Accordingly, having shown and described what is at present considered to be a preferred embodiment of the invention, it should be understood that the same has been shown by way of illustration and not limitation. All modifications, alterations, and changes coming within the spirit and scope of the invention are herein meant to be included.

What is claimed:

1. An infrared-radiation detection device comprising a plurality of layers each of which is proximate and electrically coupled to the subsequent described layer and wherein all doped layers are similarly doped, that is, either all n or all p and more specifically comprising:
    a doped conducting layer functioning as an emitter contact layer;
    a doped multiple quantum well structure layer functioning as a light sensing means;
    a doped conducting layer functioning as a base contact.
    an undoped single thick quantum barrier functioning as an electron energy high pass filter which allows electrons in defined energy ranges to proceed to the next layer and blocks electrons outside the defined energy ranges; and
    a doped layer functioning as a collector.

2. An infrared-radiation detection device comprising a plurality of layers each of which is proximate and electrically coupled to the subsequent described layer and wherein all doped layers are similarly doped, that is, either all n or all p and more specifically comprising:
    a doped conducting layer functioning as am emitter contact layer;
    a doped multiple quantum well structure layer functioning as a light sensing means;
    a doped conducting layer functioning as a base contact;
    an undoped strongly coupled superlattice structure functioning as an electron energy band pass filter which allows electrons in defined energy ranges to proceed to the next layer and blocks electrons outside the defined energy ranges; and
    a doped layer functioning as a collector.

3. An infrared-radiation detection device grown on a semi-insulating substrate comprising a multiple quantum well structure functioning as the light sensing means which consists of 50 periods of 150 Å Ga0.68 Al0.32 As undoped barrier and 74 Å GaAs well doped with n+ = $2 \times 10^{18}$cm$-3$ sandwiched between a heavily doped (n+ = $2 \times 10^{18}$cm$-3$, 3000 Å) GaAs layer functioning as the emitter contact and a lightly doped (n = $3 \times 10^{17}$cm$-3$, 1500 521) GaAs layer functioning as the base contact, followed by a GA0.65 Al 0.35$^{As}$ undoped barrier (1000 Å) functioning as the energy filter, and followed by a heavily doped (n+ = $2 \times 10^{18}$cm$-3$, 6000 Å) GaAs layer functioning as the collector.

* * * * *

UNITED STATES PATENT AND TRADEMARK OFFICE
CERTIFICATE OF CORRECTION

Page 1 of 4

PATENT NO. : 5,031,013
DATED : Jul. 9, 1991
INVENTOR(S) : KWONG-KIT CHOI

It is certified that error appears in the above-identified patent and that said Letters Patent is hereby corrected as shown below:

Column 1, line 13 - after "mechanism" insert --.--;

lines 35&36 - equation "GaAa-/Al Ga x 1 -x As" should read --$GaAs/Al_xGa_{1-x}As$--;

lines 51&52 - equation "GaAs/Al Ga x 1-x As" should read --$GaAs/Al_xGa_{1-x}As$--;

lines 54&55 - equation "Al Gax1-x As" should read --$Al_xGa_{1-x}As$--;

Column 4, line 27 - "(E1)" should read --$(E_c)_1$--;

line 39 - equation "150 ÅGa 0.68 Al 0.32 As" should read --150 Å $Ga_{0.68}Al_{0.32}As$--;

line 40 - equation "n =2x10cm-3" should read --$n^+ = 2 \times 10^{18} cm^{-3}$--;

lines 42&43 - equation "(n+=2x1018cm-3, 3000 Å) GaAs layers" should read --($n^+ = 2 \times 10^{18} cm^{-3}$, 3000 Å) GaAs layer--;

UNITED STATES PATENT AND TRADEMARK OFFICE
CERTIFICATE OF CORRECTION

PATENT NO. : 5,031,013
DATED : Jul. 9, 1991
INVENTOR(S) : KWONG-KIT CHOI

It is certified that error appears in the above-identified patent and that said Letters Patent is hereby corrected as shown below:

line 44 - equation "($n = x10^{17}$ cm-3, 1500 Å)" should read --($n = 3\times10^{17}$ cm$^{-3}$, 1500 Å)--;

line 46 - equation "Ga0.65Al0.35As" should read --Ga$_{0.65}$Al$_{0.35}$As--;

line 48 - equation "($n^+ = 2\times1018$cm-3, 6000 Å)" should read --($n^+ = 2\times10^{18}$ cm$^{-3}$, 6000 Å)--;

Column 5, line 9 - "$E_1$ to $E_1$" should read --$E_1$ to $E_2$--;

line 18 - "E" should read --$E_1$--;

line 19 - "E" should read --$E_1$--;

line 34 - equation "5.8 mWcm-2" should read --5.8 mWcm$^{-2}$--;

line 50 - equation "Ga 0.73 Al 0.27 As" should read --Ga$_{0.73}$Al$_{0.27}$As--;

line 52 - equation "Ga0.73Al0.27As" should read --Ga$_{0.73}$Al$_{0.27}$As--;

UNITED STATES PATENT AND TRADEMARK OFFICE
CERTIFICATE OF CORRECTION

PATENT NO. : 5,031,013
DATED : Jul. 9, 1991
INVENTOR(S) : KWONG-KIT CHOI

It is certified that error appears in the above-identified patent and that said Letters Patent is hereby corrected as shown below:

line 58 - "curyes" should read --curves--;

Column 6, line 12 - "hotelectron" should read -- hot electron--;

claim 1, line 32 - "." should be --;--;

claim 2, line 44 - "am" should read --an--;

claim 3, lines 59&60 - equation "150 ÅGa0.68Al0.32" should read --150 Å $Ga_{0.68}Al_{0.32}$--;

line 61 - equation "n+=2x1018cm-3" should read --$n^+ = 2 \times 10^{18} cm^{-3}$--;

line 62 - equation "(n+=2x1018cm-3, 3000 Å)" should read --($n^+ = 2 \times 10^{18} cm^{-3}$, 3000 Å)--;

lines 63&64 - equation "(n=3x1017cm-3, 1500 521)" should read --($n = 3 \times 10^{17} cm^{-3}$, 1500 Å)--;

UNITED STATES PATENT AND TRADEMARK OFFICE
CERTIFICATE OF CORRECTION

PATENT NO. : 5,031,013

DATED : Jul. 9, 1991

INVENTOR(S) : KWONG-KIT CHOI

It is certified that error appears in the above-identified patent and that said Letters Patent is hereby corrected as shown below:

line 65 - equation "$GA_{0.65} Al_{0.35}$" should read --$GA_{0.65} Al_{0.35}$--; lines 67&68 - equation "$(n+=2x10^{18} cm^{-3}, 6000 Å)$" should read --$(n^+ = 2x10^{18} cm^{-3}, 6000 Å)$--.

Signed and Sealed this

Twenty-third Day of March, 1993

Attest:

STEPHEN G. KUNIN

Attesting Officer    Acting Commissioner of Patents and Trademarks